United States Patent [19]

Yang

[11] Patent Number: 5,554,550
[45] Date of Patent: Sep. 10, 1996

[54] METHOD OF FABRICATING ELECTRICALLY ERASEABLE READ ONLY MEMORY CELL HAVING A TRENCH

[75] Inventor: Ming-Tzung Yang, Hsin Chu, Taiwan

[73] Assignee: United Microelectronics Corporation, Hsin-Chu, Taiwan

[21] Appl. No.: 305,558

[22] Filed: Sep. 14, 1994

[51] Int. Cl.$^6$ ............................................. H01L 21/8247
[52] U.S. Cl. .............................. 437/43; 437/38; 437/203
[58] Field of Search ................................ 437/38, 43, 203, 437/44

[56] References Cited

U.S. PATENT DOCUMENTS

| | | | |
|---|---|---|---|
| 4,975,383 | 12/1990 | Baglee | 437/43 |
| 4,975,384 | 12/1990 | Baglee | 437/43 |
| 5,180,680 | 1/1993 | Yang | 437/38 |
| 5,338,953 | 8/1994 | Wake | 257/316 |

OTHER PUBLICATIONS

Wolf, "Silicon Processing for the VLSI Era", 1986, pp. 175–178.

Primary Examiner—Chandra Chaudhari
Attorney, Agent, or Firm—William H. Wright

[57] ABSTRACT

A method of fabricating an EPROM cell by forming a trench in a semiconductor substrate, forming a first insulating layer over the surface of the substrate, and the sidewalls and bottom of the trench, forming individual polycrystalline silicon layers on the sidewalls of the trench, implanting a dopant into the substrate in the bottom of, and regions adjacent, the trench, forming a second insulating layer over the polycrystalline silicon layers, forming a control gate over the polycrystalline silicon layers and an electrical contact to the bottom of the trench.

15 Claims, 3 Drawing Sheets

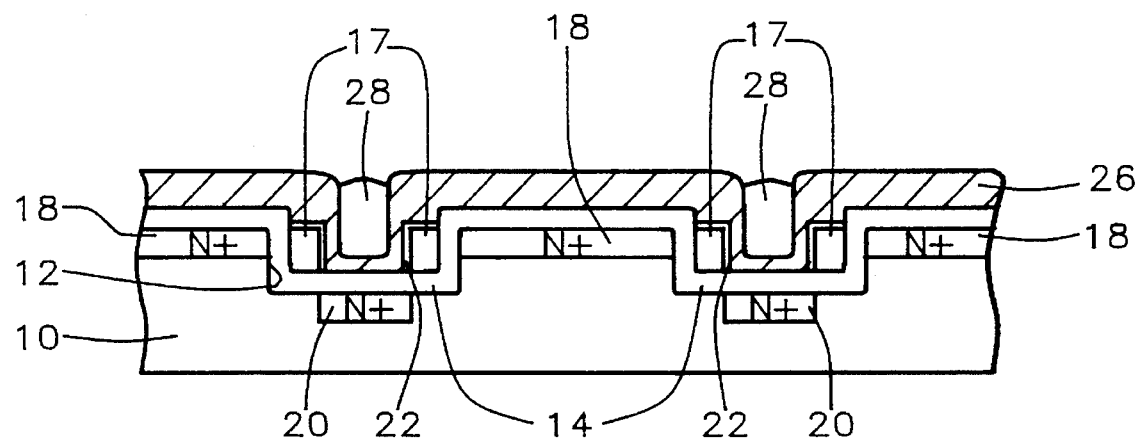
FIG. 7
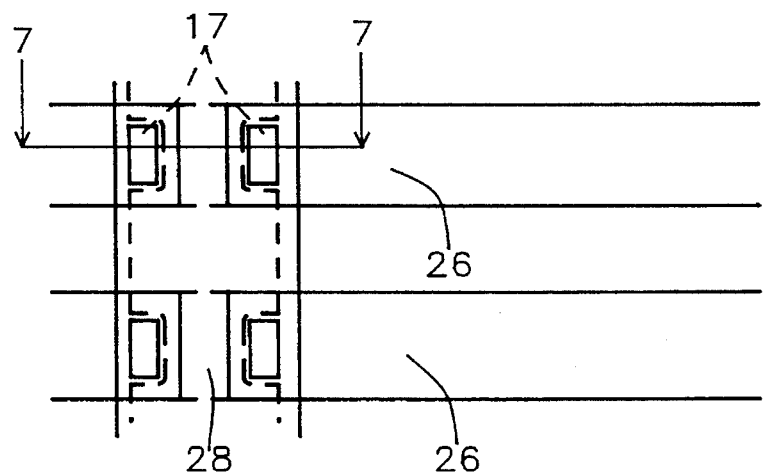
FIG. 8
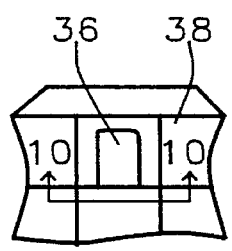  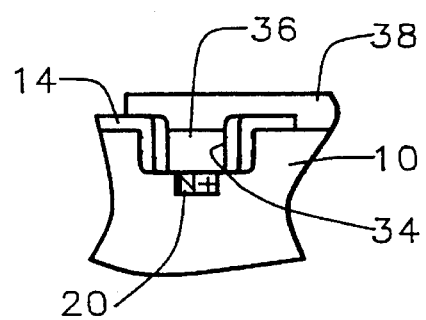
FIG. 9   FIG. 10

5,554,550

METHOD OF FABRICATING ELECTRICALLY ERASEABLE READ ONLY MEMORY CELL HAVING A TRENCH

BACKGROUND OF THE INVENTION (1) Field of the Invention

The present invention relates to an erasable electrical programmable memory cell of a type useful in VLSI technology, more specifically to an EPROM cell capable of providing a means to increase the density of cell array devices.

(2) Description of the Invention

More efficient utilization of device area in VLSI technology is a prominent objective in order to increase the density and number of devices and memory cells on a semiconductor chip in order to reduce cost and increase the speed of operation. A known technique is to place various elements, i.e. transistors, capacitors, etc. in trenches to achieve greater element density. Examples of such utilization of trench structures in EPROM devices are shown in U.S. Pat. Nos. 4,975,383 and 5,180,680.

Accordingly, an object of this invention is to describe an improved method and resulting device structure for making highly dense EPROM products.

SUMMARY OF THE INVENTION

There is provided an electrically erasable read only memory (EPROM) cell on a semiconductor substrate having a trench containing a source region at the bottom, floating gates on opposite sidewalls, separated from the substrate by a gate insulation layer. Drain regions are provided adjacent the sidewalls of the trench. A conductive word line stripe that is transverse to the trench provides a control gate. A suitable metallurgy system interconnects the source region, the drain regions, and the word line of each cell into an operative memory array.

The method of fabricating the EPROM cell of the invention involves forming a trench in a semiconductor substrate, forming a gate insulation layer on the surface of the trench, forming polycrystalline silicon floating gate layers on opposite sidewalls of the trench, implanting dopants in the surface of the substrate and bottom of the trench, and forming an insulating layer over the floating gates. A conductive word line stripe, that is transverse to the trench, is formed over the floating gates. A suitable metallurgy system is formed to interconnect the source and drain regions, and the word line stripe of each cell into an operative memory array.

BRIEF DESCRIPTION OF THE DRAWINGS

FIG. 7 is a cross sectional view which illustrates an alternate embodiment of the invention.

FIG. 8 is a top plan view of FIG. 7.

FIG. 9 is a detail view that illustrates a contact terminal for the source region.

FIG. 10 is a cross sectional view taken on line 10—10 of FIG. 9.

DETAILED DESCRIPTION OF PREFERRED EMBODIMENTS OF THE CELL

Figure 1:
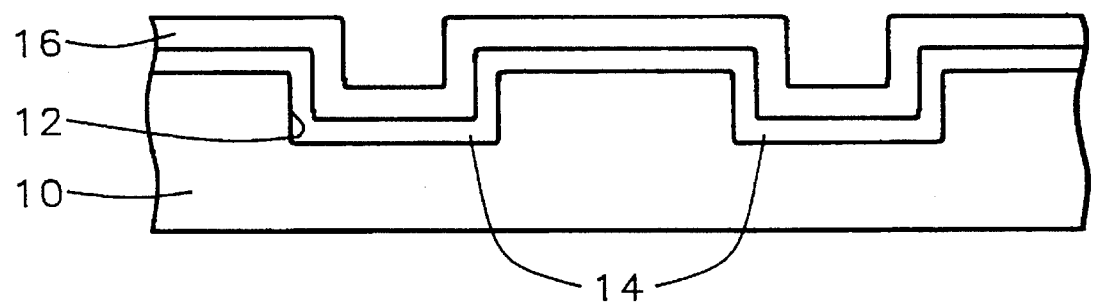
FIGS. 1 through 5 is a sequence of cross sectional views, in broken section, which illustrate the process of the invention.

Referring now to the Figs. of the drawing, there is illustrated, methods for forming two preferred specific embodiments of the EPROM cell of the invention and methods for fabricating them. It should be understood that these embodiments are not intended to severely limit the scope of this invention, since it should be understood by those skilled in the art that modifications could be made to the structures and methods of fabricating without departing from the scope and spirit of the invention.

As shown in FIG. 1, a trench 12 is formed in a semiconductor substrate 10. In practice, when a device with an array of cells is produced, a plurality of parallel elongated trenches is formed in the substrate 10. The substrate can be any suitable semiconductor material, but is preferably a monocrystalline silicon substrate, with a crystal orientation of [100], and a background doping of a concentration of P type dopant in the range of 1 E 15 to 1 E 17 $cm^{-3}$. The trench 12 will preferably have a depth in the range of 3000 to 10,000 Angstroms, a width in the range of 0.5 to 2.0 Micrometers, and spacing in the range of 0.1 to 2.0 micrometers. Most preferably the trench 12 has a depth of 0.5 to 0.7 micrometers, a width of 0.5 to 1.5 micrometers, and a spacing of 0.1 to 1.0 micrometers. The trench is formed by depositing a masking layer of a photoresist, and exposing and developing it to form openings that define the trench. The trenches are then formed by anisotropic reactive ion etching (RIE), most preferably by etching in a conventional anisotropic etching reactor using as the etching specie chlorine, hydrogen bromide, sulfur hexafluoride or carbon tetrachloride.

After the trench has been formed, the photoresist layer is removed and a first insulating layer 14 is formed on the surface of substrate 10, including the sidewalls and bottoms of the trench 12. The layer 14 will serve as a gate insulating layer in the trench and is preferably a layer of thermal $SiO_2$, when the substrate is silicon, with a thickness on the order of 50 to 300 Angstroms. This layer 14 can be formed by heating the substrate to a temperature of 900° to 1000° C., in the atmosphere of dry oxygen for a time of ½ to 3 hours. A first layer 16 of polycrystalline silicon is deposited on the surface of trench 12. The layer 16 preferably has a dopant concentration on the order of 1 E 19 to 1 E 21 $cm^{-3}$ either by deposition of undoped polysilicon and then doping with phosphorus oxychloride or P31 ion implantation, or doped in situ, and a thickness in the range of 500 to 3000 Angstroms.

Figure 2:
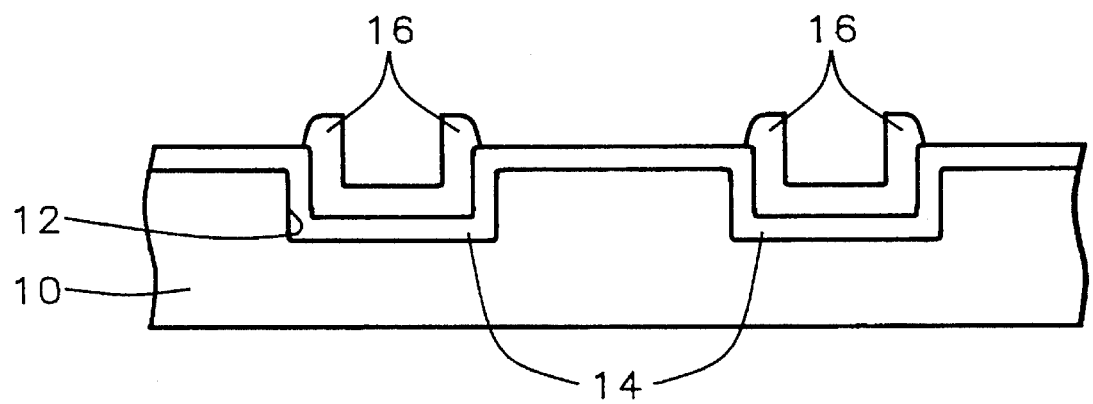
Figure 3:
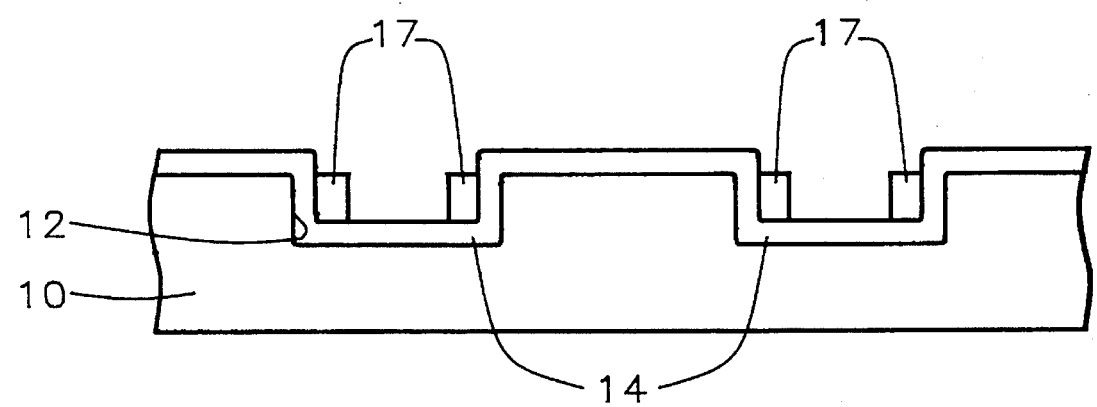
Figure 6:
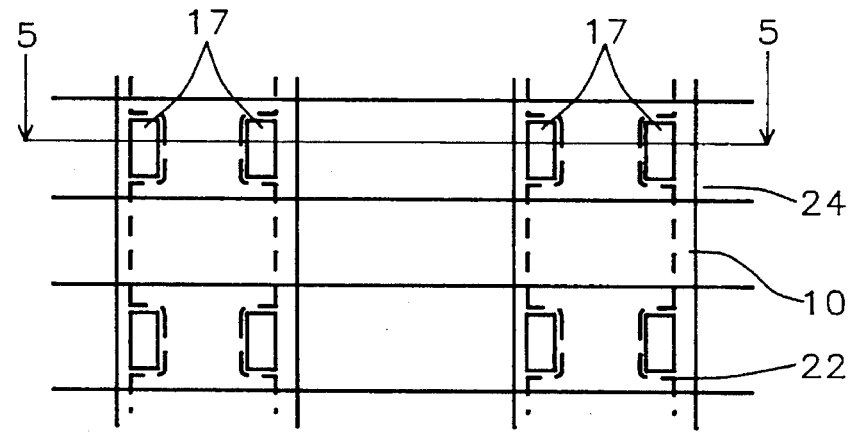
FIG. 6 is a top plan view of FIG. 5.

The major portion of layer 16 is then removed leaving only areas on opposing sidewalls of the trench 12. In forming an array of cells, a plurality of opposed areas of layer 16, which will constitute floating gates 17, are formed in the trench 12 with a longitudinal spacing of approximately 0.5 to 3.0 micrometers. This configuration can be seen more clearly in plan views FIGS. 6 and 8. Layer 16 is preferably shaped by a two step process. The portions of layer 16 on the surface are removed by masking and subtractive etching, as indicted in FIG. 2. The masking layer (not shown) is removed and the substrate exposed to anisotropic dry etch. This removes the portion of layer 16 on the bottom of trench 12 and takes a portion off the top edges, resulting in floating gates 17, as shown in FIG. 3.

Figure 4:
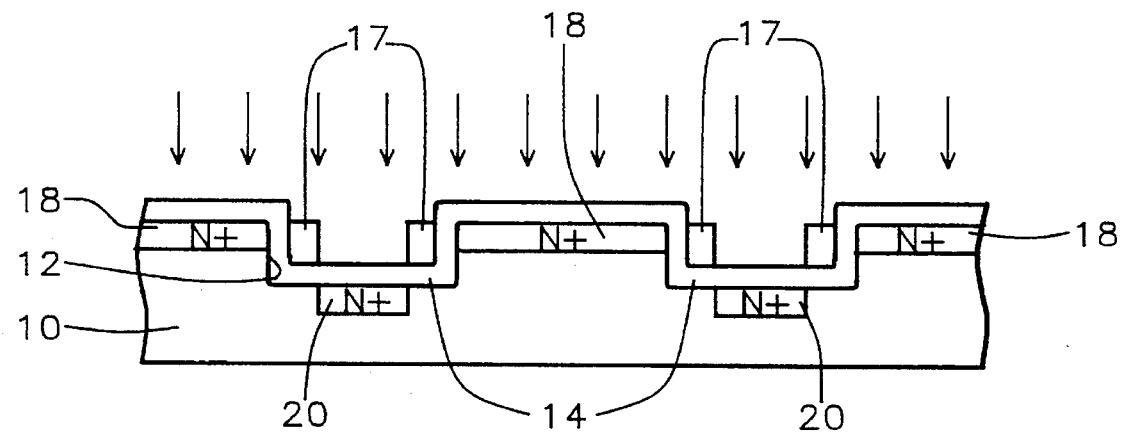

As indicated in FIG. 4, dopant ions are introduced into the substrate 10, adjacent to the surface between the trenches, forming drain regions 18 and in the bottom of the trench between the gate electrodes 17, to form source regions 20. Preferably arsenic ions are implanted with an acceleration voltage of 40 to 120 KEV, with a dosage in the range of 5 E 14 to 1 E 16 ions/cm² followed by an annealing step at conditions 800° to 900° C. The resultant regions 18 and 20 will preferably have an average dopant concentration on the order of 1 E 19 to 1 E 21 cm⁻³.

Figure 5:
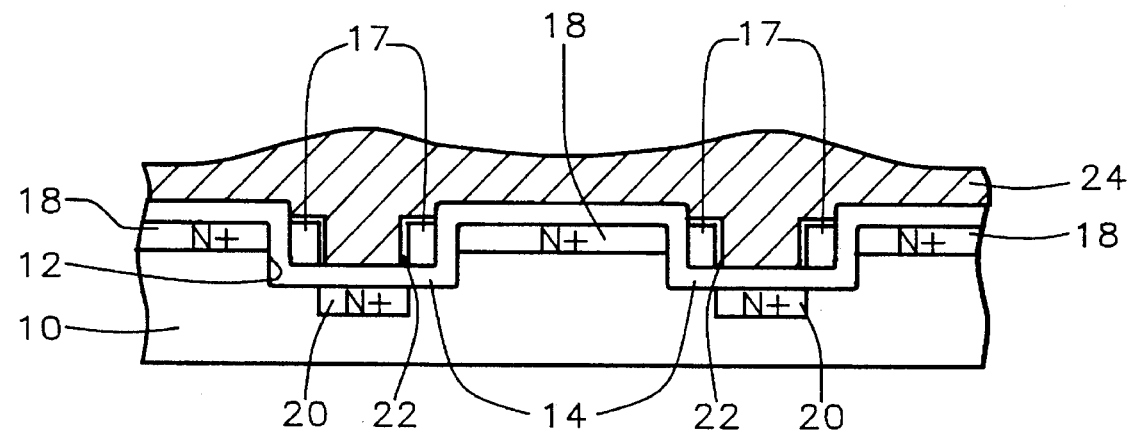

As shown in FIG. 5, a second insulating layer 22 is formed over floating gate electrodes 17. This layer can be a thermal $SiO_2$ layer, a chemical vapor deposition $SiO_2$, or a composite layer of $SiO_2$ and $Si_3N_4$. The techniques for forming such layers are well known. The layer 22 preferably has a physical thickness in the range of 100 to 400 Angstroms and an equivalent dielectric layer (silicon dioxide) thickness of between about 50 to 300 Angstroms.

A conductive word line stripe 24, that is transverse to the trenches, is formed over floating gates 17. Stripe 24, separated from floating gates 17 by a thin insulating layer 22 serves as a control gate electrode for the memory cell. The stripe 24 can be formed of any suitable conductive material. Preferably stripe 24 is formed of doped polycrystalline silicon. Stripe 24 can be formed by depositing a layer of polycrystalline silicon and shaping the stripe using conventional masking and etching techniques. The polycrystalline silicon is preferably deposited by low pressure chemical vapor deposition (LPCVD) using a silane or $Si_2H^6$ ambient gas as the source of silicon within a chamber having a pressure of between about 0.001 mTorr to 10 Torr and a temperature of between about 500° to 700° C. The polycrystalline silicon substantially fills the trenches and provides a relatively planar surface. The relationship of the word lines 24 with the trenches and floating gates is illustrated more clearly in FIG. 6.

An alternative word line stripe structure is shown in FIGS. 7 and 8. In this embodiment stripe 26 is a polysilicon stripe deposited by LPCVD using a silane or $Si_2H_6$ ambient gas as the source of silicon within a chamber having a pressure of between about 0.001 mTorr to 10 Torr and a temperature of between about 500° to 700° C. Note that stripe 26 is a conformal layer, i.e. having a relatively uniform thickness. The surface of stripe 26 is non-planar, since it is deposited on a non-planar surface. In order to restore a measure of planarity to the surface, a layer of $SiO_2$ or borophospho silicate glass is deposited by spin-on techniques, and an etch back performed. This fills the depressions with insulation material 28. A passivating layer can then be deposited, and a metallurgy layer formed thereon.

An electrical contact is made to source region 20, as shown in FIGS. 9 and 10. The contact is preferably in the end of the trench 12. An opening 34 is made to region 20, as most clearly shown in FIG. 10, and the opening filled with a conductive material 36, preferably tungsten, titanium-tungsten, or polycrystalline silicon using well known etching and deposition techniques. A suitable metallurgy stripe 38 is deposited to contact plug 36 to supply the voltage to region 20 which is necessary for operation. The metallurgy stripe 38 is typically aluminum, aluminum/silicon/copper, aluminum/copper, or the like.

The operation of the cell of the invention may be understood by those skilled in the art with reference to the following table:

TABLE

|  | $V_G$ (control gate), 40 | $V_D$ (drain), 30 | $V_S$ (source), 38 |
| --- | --- | --- | --- |
| WRITE | 12.5 Volts | 6 to 8 Volts | 0 Volts |

TABLE-continued

|  | $V_G$ (control gate), 40 | $V_D$ (drain), 30 | $V_S$ (source), 38 |
| --- | --- | --- | --- |
| READ | 5.0 Volts | 1.5 to 2 Volts | 0 Volts |
| ERASE | 0 Volts | 0 Volts | 12.5 Volts |

It is of course understood that erasure can be also accomplished by ultraviolet (UV) light.

While the invention has been particularly shown and described with reference to the preferred embodiments thereof, it is will understood by those skilled in the art that various changes and modification can be make in the invention without departing from the spirit and scope of the invention.

What is claimed is:

1. A methods of fabricating an electrically programmable read only memory cell on a semiconductor substrate comprising:

forming an elongated trench in said substrate, forming a first insulating layer over the surface of said substrate, including the sidewalls and bottom of said trench, forming individual multiple pairs of spaced polycrystalline silicon layers on the opposed sidewalls of the trench, which form floating gates, implanting a first type dopant into said substrate thereby forming a continuous doped region in the bottom of said trench, which form a continuous source region, and also individual doped regions on opposite sides of the trench, adjacent to the top surface of the substrate, which form the drain regions, forming a second insulating layer over the said individual pairs of spaced polycrystalline silicon layers, forming a conductive control gate word line stripe over, and transverse to the trench adjacent to the individual polycrystalline silicon layers, and forming an electrical contact to the continuous doped region in the bottom of the trench.

2. The method of claim 1 wherein the trench is formed by anisotropic reactive ion etching.

3. The method of claim 2 wherein the trench has a depth in the range of 0.5 to 2.0 micrometers and a width in the range of 0.5 to 1.5 micrometers.

4. The method of claim 2 wherein said substrate is monocrystalline silicon, and said first insulating layer is formed by thermally oxidizing the substrate, the resultant thickness of the first insulating layer being in the range of 50 to 300 Angstroms.

5. The method of claim 2 wherein said first insulating layer is a composite layer of $SiO_2$, $Si_3N_4$ and $SiO_2$, and the overall thickness is in the range of 100 to 400 Angstroms.

6. The method of claim 2 wherein said polycrystalline silicon layers have a thickness in the range of 500 to 3000 Angstroms.

7. The method of claim 6 wherein a polycrystalline silicon layer is deposited on the surface of the substrate, the top surface portions removed by masking the trench portions and subtractively etching the exposed portions, and subsequently removing the mask and exposing the remaining layer to an anisotropic dry etch that removes the layer portion on the bottom of the trench and the upper end portions of the layers on the sidewalls of the trench.

8. The method of claim 7 wherein the second insulating layer is $SiO_2$ with a thickness in the range of 50 to 300 Angstroms, and is formed by chemical vapor deposition.

9. The method of claim 7 wherein the second insulating layer is $SiO_2$, $Si_3N_4$ and $SiO_2$ with an overall thickness in the range of 100 to 400 Angstroms.

10. The method of claim 2 wherein the conductive word line stripe is formed of polycrystalline silicon.

11. The method of claim 10 wherein said stripe is formed by using a silane or $Si_2H_6$ ambient gas as the source of silicon within a chamber having a pressure of between about 0.001 mTorr to 10 Torr and a temperature of between about 500° to 700° C.

12. The method of claim 11 wherein the thickness of the stripe is between about 500 to 8000 Angstroms.

13. The method of claim 1 wherein the electrical contact to the doped region beneath the trench is formed at the end of the trench by etching an opening to the bottom of the trench and filling the opening with a conductive metal.

14. The method of claim 1 wherein a passivating layer is deposited on the substrate after the stripe has been completed.

15. The method of claim 14 wherein a layer of borophospho silicate glass is deposited by spin on techniques, and the layer etched back.

* * * * *